United States Patent
Narendra et al.

(10) Patent No.: US 7,051,295 B2
(45) Date of Patent: May 23, 2006

(54) IC DESIGN PROCESS INCLUDING AUTOMATED REMOVAL OF BODY CONTACTS FROM MOSFET DEVICES

(75) Inventors: Siva G. Narendra, Portland, OR (US); Daniel S. Klowden, Tacoma, WA (US); James W. Tschanz, Portland, OR (US); Nitin Borkar, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 252 days.

(21) Appl. No.: 10/746,759

(22) Filed: Dec. 23, 2003

(65) Prior Publication Data
US 2005/0138579 A1    Jun. 23, 2005

(51) Int. Cl.
G06F 17/50    (2006.01)

(52) U.S. Cl. .............................. 716/2; 716/11

(58) Field of Classification Search .............. 716/1–18; 438/142–158; 327/210, 365–377
See application file for complete search history.

(56) References Cited

U.S. PATENT DOCUMENTS 6,766,496 B1 * 7/2004 McManus et al. ............. 716/1
6,907,587 B1 * 6/2005 Rittman et al. ................ 716/5

\* cited by examiner

Primary Examiner—Vuthe Siek
Assistant Examiner—Nghia M. Doan
(74) Attorney, Agent, or Firm—Schwabe, Williamson & Wyatt, P.C.

(57) ABSTRACT

An apparatus for and method of modifying an IC design layout of an integrated circuit, comprising: accessing an initial IC design layout, with the initial layout including a plurality of MOSFET devices having a common substrate; and removing a plurality of body contacts of the MOSFET devices to create a first modified IC design layout.

26 Claims, 7 Drawing Sheets

IC DESIGN PROCESS INCLUDING AUTOMATED REMOVAL OF BODY CONTACTS FROM MOSFET DEVICES

BACKGROUND OF THE INVENTION

1. Field of the Invention

The present invention relates to electronic design automation, and more particularly, to design layouts for integrated circuits.

2. Description of Related Art

A specialized field, commonly referred to as "electronic design automation" (EDA), has evolved to handle the demanding and complicated task of designing, laying out and verifying integrated circuit (IC) semiconductor chips. In EDA, computers are extensively used to automate the design, layout and verification process. The first step of the EDA design process typically involves the formal specification of the design, using hardware design languages such as Verilog or VHDL, and synthesis of the design into netlists of devices to be placed and routed. Typically, the synthesized design is stored on a computer tape or disk. The next step of the process typically involves the use of circuit simulation software to test the synthesized design of the IC to see if it operates as needed.

Once the IC design has been verified through computer simulation, the third step in the EDA design process is the use of layout software to generate component placement and interconnections for the components. However, before fabrication on the semiconductor chip begins, extensive further verification and/or testing are typically performed to further verify and check that the IC has been properly designed and physically laid out. This is accomplished in a fourth step of the EDA design process wherein design checks are performed, and IC simulation software and/or emulation system are used to test the operation and performance of the proposed IC. A pre-defined set of rules are also stored. These rules may specify certain dimensions and other criteria for checking to determine whether the new design has been properly laid out. Thereafter, simulation and/or emulation may be performed. Hence, new designs and layouts are subjected to a host of rigorous verification and testing procedures, including procedures which check the physical layout to ensure that it meets certain well-established rules or guidelines.

Often, several iterations of the design, layout, and verification process are required in order to optimize the IC's size, cost, heat output, speed, power consumption, and electrical functionalities. After the IC design has been established to be good, the fifth step in the EDA process involves the use of mask fabrication software to generate masks for manufacturing the ICs, which are then used to manufacture IC prototypes. These IC prototypes are further tested by automated test equipment (ATE).

When a semiconductor process is an n-well process (PMOS devices formed in n-wells), the NMOS devices of an integrated circuit (IC) chip share a common p-substrate. This is illustrated in FIG. 1 by a simple semiconductor wafer 10 having a p-substrate 12. In this simplified example, the wafer 10 has a pair of n-wells 14 and 16 formed in a p-epitaxy or p-epi layer 18. The p-epitaxy layer 18 is deposited epitaxially (deposition of vapors) on top of the p-substrate 12. A plurality of first PMOS devices (not shown) may be formed in the n-well 14 and a plurality of second PMOS devices (not shown) may be formed in n-well 16. A plurality of NMOS devices (not shown) may be formed in the p-epitaxy layer 18. The wafer cross-section of FIG. 1 illustrates that in the n-well process the body terminals for applying a body bias voltage (i.e., "body bias") for PMOS devices are the n-wells 12 and 14 and the body terminal for NMOS devices is the p-epitaxy layer 18 and the p-substrate 12. Hence, the NMOS devices would have a common body terminal in the p-substrate 12, whereas the first and second PMOS devices have isolated, non-common body terminals of the n-well 12 and n-well 14, respectively. When a semiconductor process is a p-well process (NMOS devices formed in p-wells), the PMOS devices of an IC design, formed in an N-epi layer, share a common N substrate.

FIG. 2 shows the cross-section of an NMOS device 20 in an IC chip using the prior art n-well process shown in FIG. 1, with the NMOS device 20 having an n+ drain 21, a drain contact 22, an n+ gate 24, an n+ source 25, a source contact 26, and a body contact 28. The body contact 28 (also referred to as p-substrate contact, p-substrate tap or p-tap) is connected at one end to a p-epitaxy layer 30 and also through the p-epitaxy layer 30 via a highly doped p+ region 31 to a p-substrate 32. The p-epitaxy layer 30 and the p+ region 31 are physically separate but electrically the same (shorted), since they are of the same doping type (P type). The plus sign of the p+ region 31 merely indicates that the doping levels are higher in the p+ region 31. The p+ region 31 extends through the entire p-epitaxy layer 30 and abuts against the p-substrate 32 to provide an electrical path to the p-substrate 32 which circumvents the high resistance of the lightly doped p-epitaxy layer 30. The body contact 28 is connected at the other end to the source contact 26 that is at 0 volts (ground). Hence, the body contact 28 is shorted to ground. The source and body contacts 26 and 28 combine to form a U-shaped metal contact, labeled "METAL1", with an insulating material 33 included in the interior of the U-shaped metal contact.

FIG. 3 shows a schematic diagram of the NMOS device 20 of FIG. 2 wherein the source 25 and the body (p-epitaxy layer 30 and the p-substrate 32) are shorted together; hence, a body bias voltage Vbb applied from the source 25 to the p-epitaxy layer 30 is zero. By definition, the NMOS device 20 has a zero body bias or no body bias. Depending upon the application, the NMOS device 20 may be modified to have a non-zero body bias voltage Vbb. In such a case, when the NMOS device 20 is in an active mode, the voltage Vbb is such that a forward bias is applied, which in turn increases the threshold voltage of the NMOS device 20. Likewise, a reverse bias Vbb may be applied to lower the threshold voltage. Body bias has several applications including leakage current control and adaptive frequency modulation.

In the prior art, most designs that require body bias have to be planned in advance during the EDA process, since inclusion of body bias requires the routing of an additional sparse bias grid and an on-chip bias circuit to generate the body bias voltage Vbb. If off-chip bias generation is included in the IC design, then the chip planning has to be done for the bias grids.

DETAILED DESCRIPTION OF AN ILLUSTRATIVE EMBODIMENT

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 3:
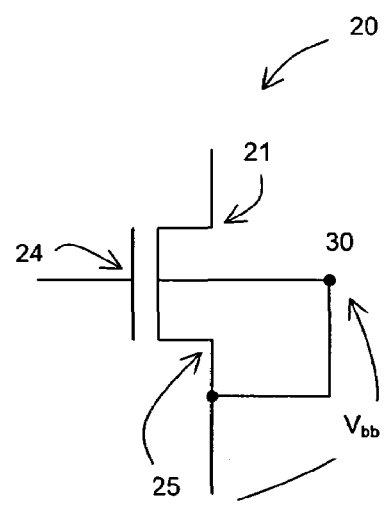
FIG. 3 is a circuit schematic of the prior art NMOS device of FIG. 2.
Figure 4:
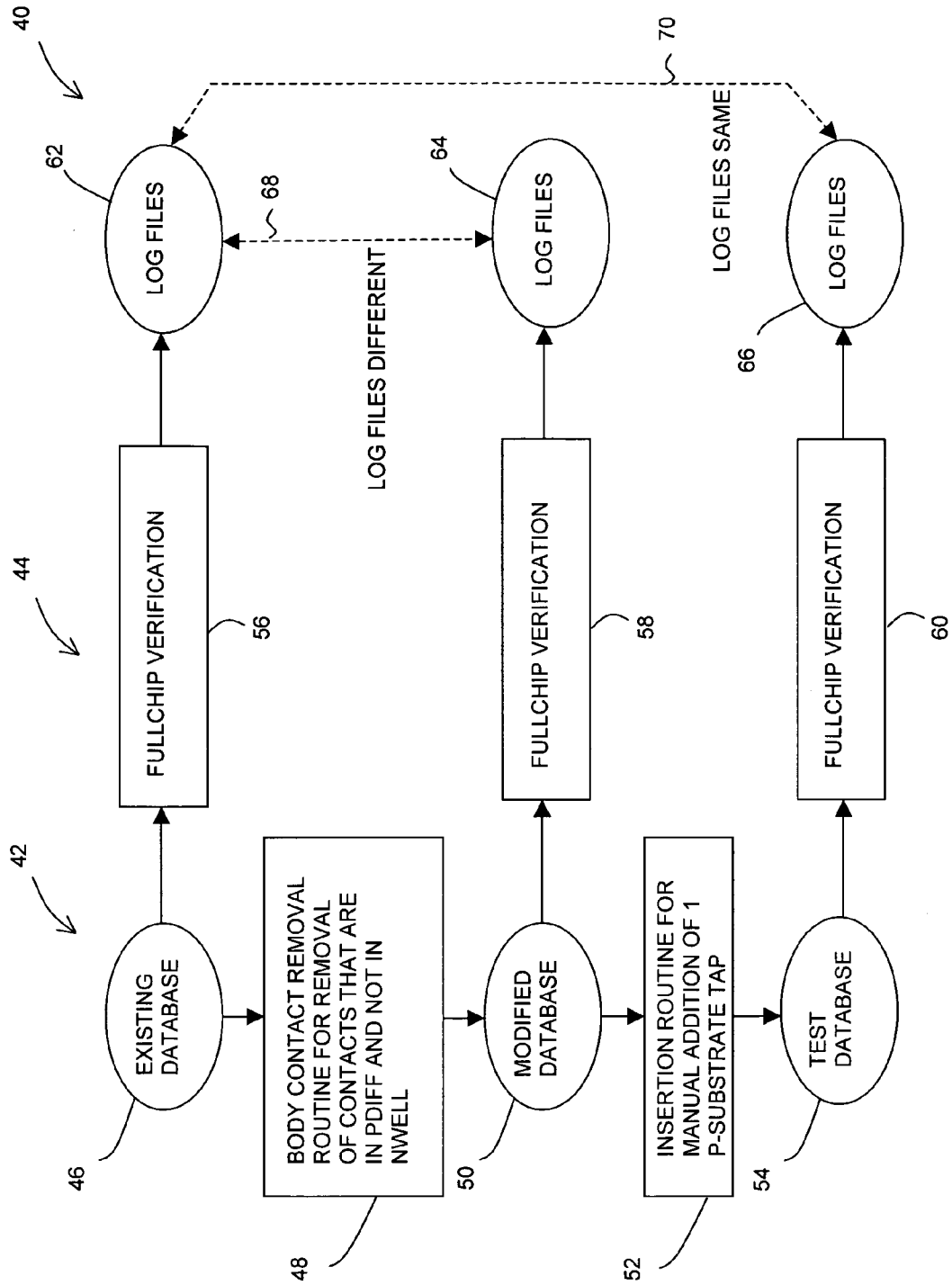
FIG. 4 is a flow chart of a body bias enabling process according to one embodiment of the present invention.

In FIG. 4 a body bias enabling process 40, according to one embodiment of the present invention, is described for enabling body bias in a pre-existing IC design not having the body bias enabled. The pre-existing IC design may have a plurality of the MOSFET devices, either N-type or P-type, with a common substrate. By providing body bias enablement, the process 40 may provide for applying a body bias voltage to each of the plurality of MOSFET devices with the common substrate. An example of one such MOSFET device, prior to body bias enablement, is the NMOS device 20 shown in FIGS. 2 and 3, which has a zero body bias voltage. An example of such a pre-existing IC design used herein may be an existing version of a microprocessor design without body bias.

The process 40 enables a faster turn around time in creating a new version of the microprocessor design, which is body bias enabled. As will be apparent from the description to follow, many of the conversion steps are automated. Most prior methods depend on floor-planning and layout from scratch to convert such a pre-existing IC design, which has a significant impact on the design schedule. By using the process 40, it is possible to successfully convert the preexisting non-body bias enabled version of the microprocessor to a version which is body bias capable for its MOSFET devices within a substantially reduced period of time and with a relatively small engineering team. In other words, the process 40 allows for the conversion of current design layouts for IC circuits without body bias to include body bias without a significant impact on the design schedule.

If the semiconductor process uses n-wells, the NMOS devices have a common p-substrate and if the semiconductor process uses p-wells, the PMOS devices have a common n-substrate. Hence, in one embodiment, the process 40 is applied to an IC design layout where the NMOS devices have a common p-substrate and the PMOS devices are formed n-wells. In another embodiment, the process 40 is applied to an IC design layout where the PMOS devices have a common n-substrate and the NMOS devices are formed in p-wells.

FIG. 4 illustrates a flow chart of the body bias enabling process 40 in accordance to one embodiment of the present invention. The process 40 is incorporated into a layout software program. The layout software program, which is modified to include the process 40, is used to place and route the actual logic, physical pinouts, wiring, and/or interconnects according to the circuit design to produce an IC design layout of the semiconductor chip. The design layout is stored in a database as a series of layers. In addition to the placement of components and interconnections, the layout software also may include software verification routines incorporating verification procedures for checking the design layouts contained in the database. A pre-defined set of design rules also may be stored in addition to the design layout. These rules specify certain dimensions and other criteria for checking to determine whether the new design has been properly laid out. The verification routines instruct the computer to apply a rule to specific portions of the design layout residing in a database. If that part of the design layout meets the rule, then it passes the test. Otherwise, it fails, and the error may be duly recorded in log files.

The body bias enabling process 40 may include two general software procedures. First, there is a layout modification procedure 42 directed toward layout modification of a pre-existing IC design. Second, there is a verification procedure 44 directed toward verification of the design layout modifications, with the verification procedure 44 being repeatedly invoked during the layout modification procedure 42.

Referring to FIG. 4, the layout modification procedure 42 starts with accessing an initial (preexisting) design layout of the IC design contained in a preexisting database 46. In this illustrative case, the IC design may be for a current version of a microprocessor without body bias. As illustrated by the NMOS device in FIGS. 2 and 3, the NMOS devices represented in this initial IC design layout have their grounded source contacts and body contacts shorted together; hence, their body bias voltages are zero. In one embodiment, a body contact removal routine 48 may invoke a removal script to locate and automatically remove the body contacts from the NMOS devices in the initial IC design layout. The body contacts of NMOS devices having a common p-substrate are removed, but the body contacts PMOS devices formed in n-wells are not removed. These changes to the initial IC design layout generate a first modified IC design layout which is stored in a modified database 50.

The script of the body contact removal routine 48 checks for the location of the contacts in the initial IC design layout in the existing database 46. In this initial layout, there are body contacts which engage p-diffusions formed in the p-epitaxial layer 30 and not in an n-well. An example of this is the body contact 28 of FIG. 2 which engages the p+ region 31, which is a p-diffusion. There also may be contacts which engage components of PMOS devices (e.g., drains, sources), such components also being p-diffusions, but located in n-wells and not located in the p-epitaxial layer. If the contact engages a p-diffusion (e.g., p+ region 31) which is not located in an n-well, then that p-diffusion is making an electrical connection between the p-substrate and the body contact (e.g., body contact 28) of the existing power grid. Such contacts may be deleted to form the first modified IC design layout in the modified design database 50. As described with respect to FIG. 2, the p-diffusion region engaging the body contact may also be changed to an n diffusion, e.g., the p+ region 31 may be changed to an n+ region in FIG. 2. In this case, it is unnecessary to further check and see if the n-diffusion is not in an n-well. But in FIG. 4, it is assumed that a p-diffusion, and not an n-diffusion, is used to connect the body contact to the p-substrate. Also, as previously mentioned, the p-diffusion to the substrate does not need to be removed but may be removed with the body contact.

Figure 5:
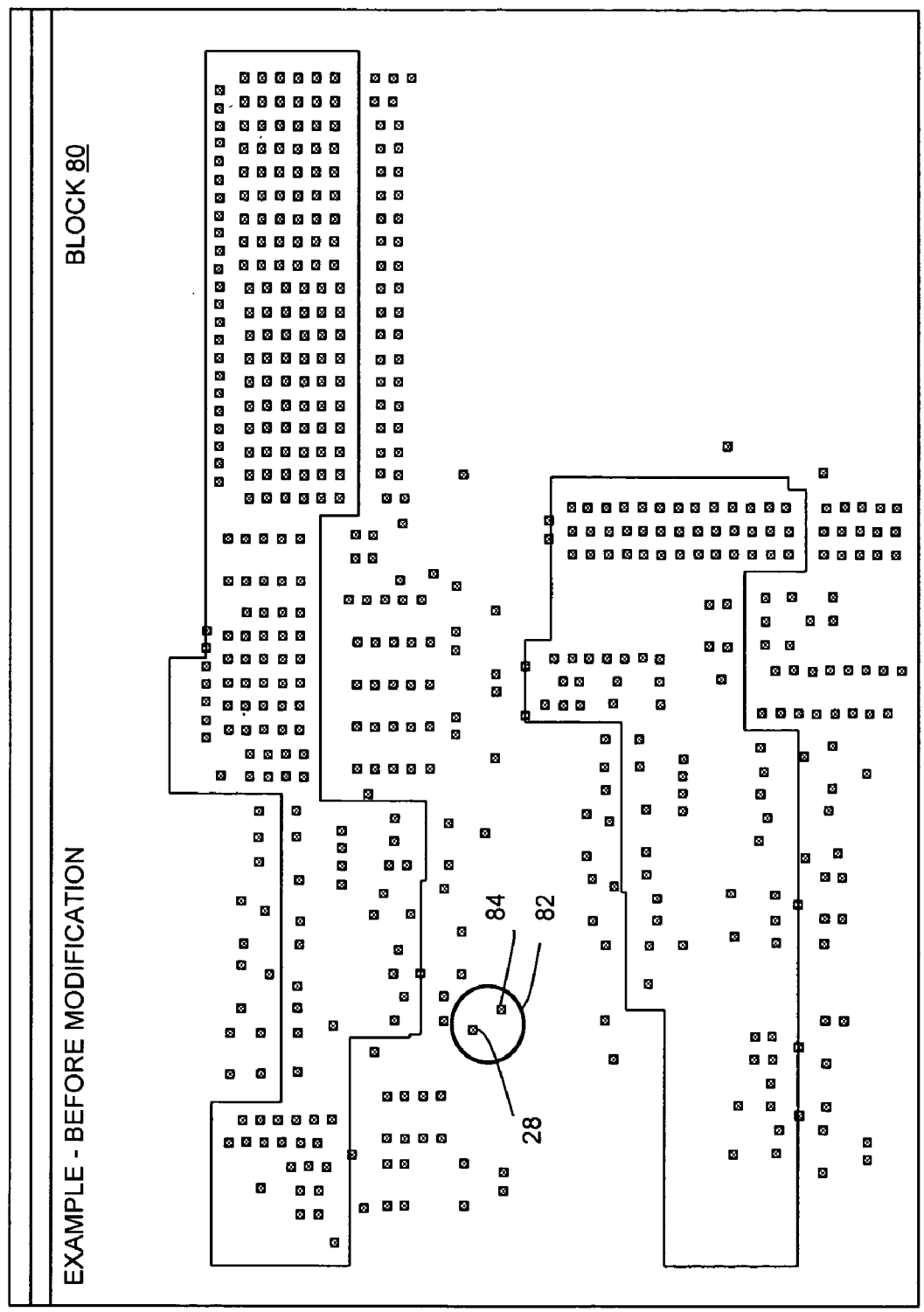
FIG. 5 shows a block of a contact plane for an integrated circuit design layout containing the NMOS device of FIGS. 2 and 3.

For the script of the routine 48 to know if a contact meets the criteria described above, it may look at the polygons in different mask layers. Such polygons may be standalone or abutting squares and/or rectangles. Contacts may be squares in p or n diffusion as shown in FIG. 5, to be discussed hereinafter. Each mask layer may have the same set of coordinates and represents one "plane" of the silicon chip. The mask layers of interest to the routine 48 may include a contact plane, p-diffusion plane, and n-well plane. As one example, the layers may be arranged so that the contact plane is on top of the p-diffusion plane, which in turn is on top of the n-well plane. In each plane there may be filled and empty regions. For example, in the contact plane there may be several million contacts represented as distinct squares that are filled (presence of contacts) and rest of the plane is empty (absence of contacts). If the presence of a contact in the contact plane coincides with presence of p-diffusion polygon in the p-diffussion plane in the same coordinate and there is no n-well polygon in the same coordinate then that contact is removed. In the case of an n-diffusion for a connection through the epi layer to the substate, it is unnecessary to check and see whether it is located in an n-well, because only p-diffusions are used in the n-wells. N-wells are a type of n-diffusions but not of the size of the n-diffusion used for the contacts.

Figure 6:
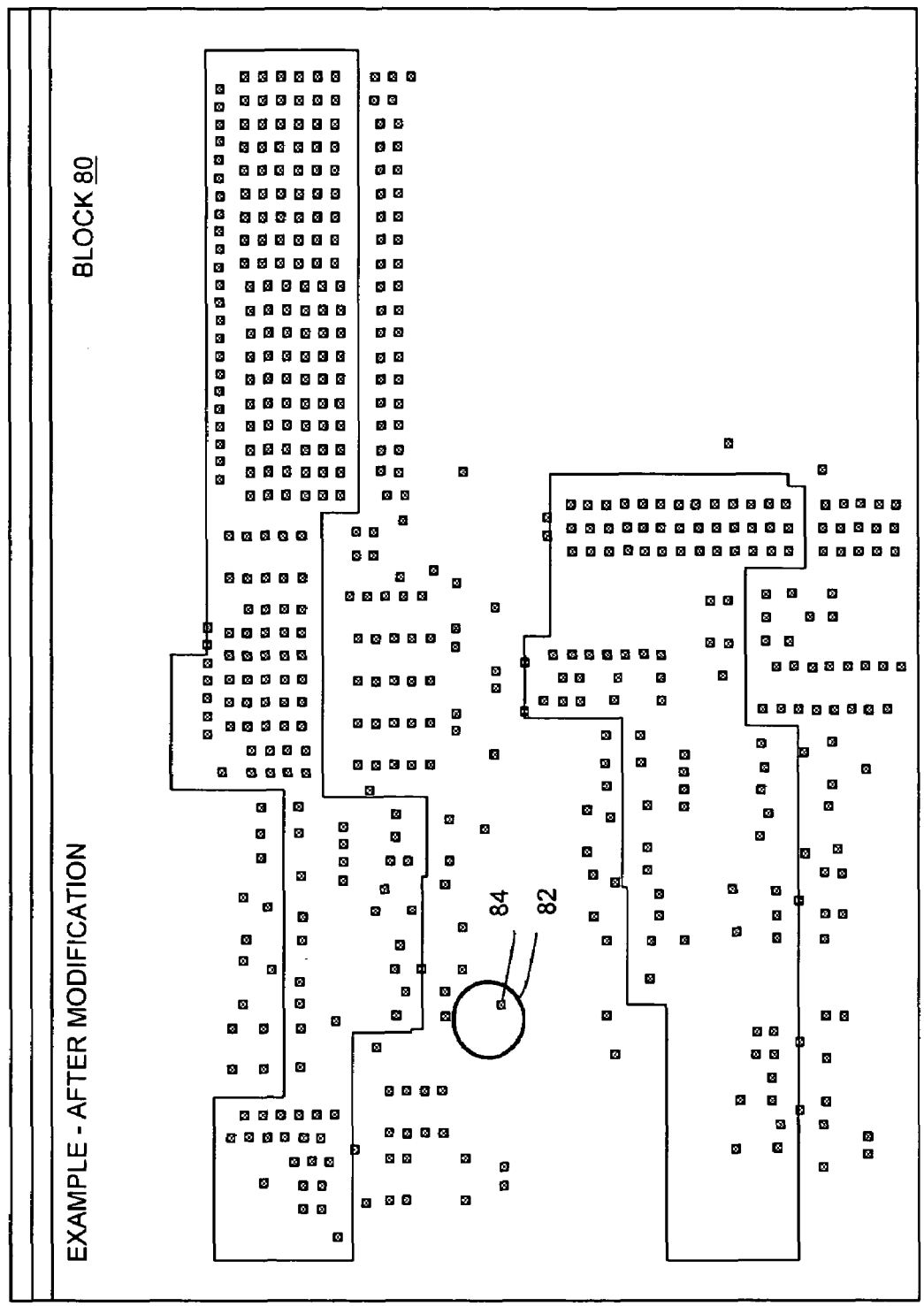
FIG. 6 shows the block of FIG. 5 after being modified by a body contact removal process of FIG. 4 to produce an NMOS device of FIGS. 7 and 8.

Each layer or plane of the initial IC design layout may be further divided into a plurality of blocks. For example, in the illustrative IC design layout for the microprocessor, FIG. 5 shows one of a plurality of blocks 80 for the contact plane which has all of its p-substrate body contacts before any are removed by the body contact removal routine 48 of FIG. 4. In particular, within an illustrative circle 82 there is shown the body contact 28 of the NMOS devices 20 of FIGS. 2 and 3 and another contact 84 not meeting the above described criteria for removal. In this IC design for the microprocessor, n-wells are used for PMOS devices and NMOS devices having a common p-substrate. FIG. 6 shows the block 80 with the body contact 28 removed in accordance with the body contact removal routine 48 of the layout modification procedure 42 of FIG. 4.

After generating a first modified IC design layout, an insertion routine 52 allows a user to access the first modified IC design layout and to manually insert of at least a single p-substrate or body tap on the backside of the p-substrate. This further change generates a second modified IC design layout which is stored in a test database 54. The single p-substrate tap is introduced by the insertion routine 52 solely for verification purposes. For subsequent implementation of an on-chip or off-chip bias circuit (described hereinafter) for the IC, the number of new substrate taps added and connected to the bias grid circuit may be in the range of the number of the body contacts removed by the body contact removal routine 48. The addition of the single p-substrate (or in some cases a few taps) creates the second modified IC design layout of the test database 54. The test database 54 allows for verifying that in the modified database 50 all the original p-substrate taps connected to 0V (shorted to source) were removed and nothing else was removed.

The verification procedure 44 includes a full chip first verification routine 56 which tests the initial IC design layout in the existing database 46, a full chip second verification routine 58 which tests the first modified IC design layout in the modified database 50, and a full chip third verification routine 60 which tests the second modified IC design layout in the test database 54. The results of the full chip verifications of routines 56, 58 and 60 are to generate log files 62, 64, and 66, respectively. Log files may be compared to determine whether they are different or the same. A first comparison routine 68 is shown for comparing the first log files 62 and the second log files 64. A second comparison routine 70 is shown for comparing the first log files 62 and the third log files 66. More specifically, when all the body contacts are removed in the first modified IC design layout of the modified database 50, the first and second log files 62 and 64 should look different. Hence, as a result of the comparison made by the first comparison routine 68, if the body contacts were removed, then the two files 62 and 64 are determined to be different. Once the single p-substrate tap is added to create the second modified IC design layout of the test database 54, then the log files 66 should look the same as the original log files 62. This comparison of the log files 66 and 62 to determine the desired result of the files being the same, is made by the second comparison routine 70. The comparisons of the first and second comparison routines 68 and 70 may be undertaken by a user of the layout program inspecting the log files 62, 64, and 64 or the two comparisons may be automated as part of the layout design program.

Elaborating on the above-described verification procedure 44, when the body contacts are removed, the fullchip verification 58 reports that the p-substrate is floating and issues several warnings. Regardless of the details of these warnings, the new log files 64 do not match the original log files 62. Now to make sure that the automated removal routine 48 did not remove other useful layers by mistake, the insertion routine 52 allows the user to add back manually, in a controlled manner, one or more p-substrate taps. Thereafter, when the verification flows of the fullchip verification 60 are run, if the body contact removal routine 48 has just removed the body contacts and nothing else, then the new flow results should match the original results from the fullchip verification 56. If this is not true, then the automated flow of the body contact removal routine 48 did not achieve the contact removal task correctly. In the verification procedure 44, the step of verification by the fullchip verification 60 does not distinguish between a single short created by one contact from a plurality of shorts created by a million contacts. In implementing a bias grid circuit described hereinafter after process 40 is completed, a plurality of p-substrate contacts may be used so as to provide good electrical contact with low resistance, e.g., the new contacts added for the bias circuit may match the number of contacts that have been removed by the removal routine 48.

Figure 1:
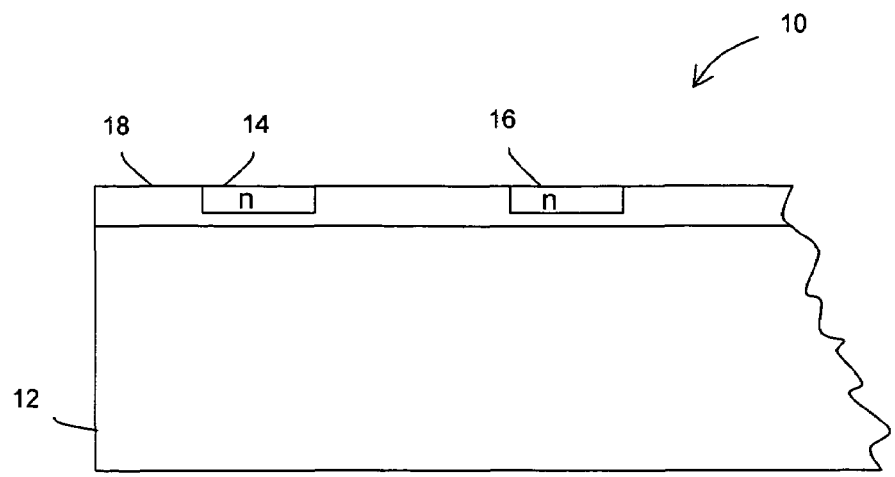
FIG. 1 a cross sectional view of a prior art semiconductor wafer using an n-well process, which illustrates locations of body terminals for NMOS and PMOS devices.
Figure 2:
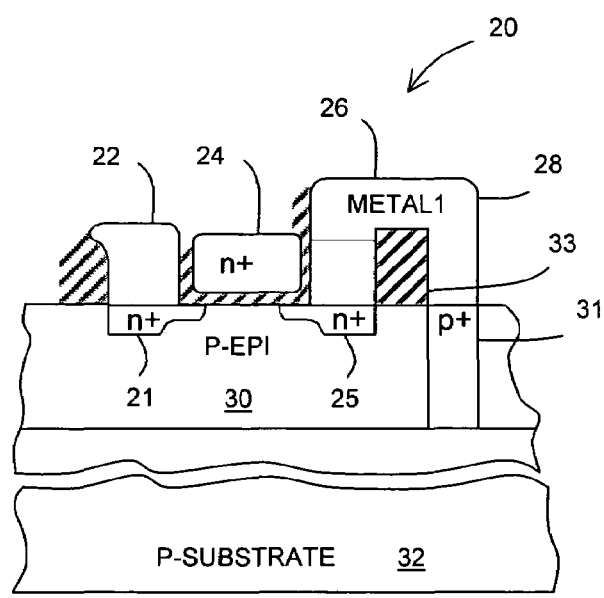
FIG. 2 is a cross-sectional view of a prior art NMOS device in an integrated circuit chip using the n-well process of FIG. 1.
Figure 7:
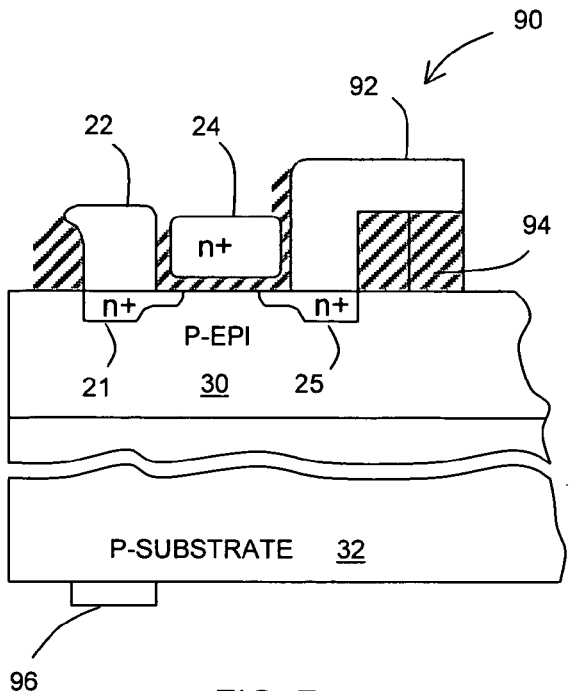
FIG. 7 is a cross-sectional view of the NMOS device of FIGS. 2 and 3 after modification by the body contact removal process of FIG. 4.

FIG. 7 shows the cross-section of a NMOS device 90, which is the NMOS device 20 of FIGS. 2 and 3 modified by the process of FIG. 4. More specifically, the initial IC design layout found in the existing database 46 (FIG. 4), which includes the NMOS device 20 (FIGS. 2–3), is modified by the body contact removal routine 48 (FIG. 4) to obtain the first modified IC design layout contained in the modified database 50 (FIG. 4), which includes the NMOS device 90.

In FIG. 7 those elements of the NMOS device 90 that have not been modified from their form shown in FIG. 2 retain the same reference numerals.

Referring to FIG. 7, the drain 21, drain contact 22, the gate 24, the source 25, the p-epitaxy layer 30, and the p-substrate 32 of the NMOS device 90 remain essentially the same as shown in FIG. 2. There is now a new, L-shaped source contact 92 which results from the truncation of the U-shaped contact (source and body contacts combined) of FIG. 2. The body contact (body contact 28 in FIG. 2) has been removed and an insulating material 94 has been put in its place (a lateral extension of the insulating material 33 of FIG. 2). In various embodiments, the p+ region 31 of FIG. 2, which connects the metal body contact 28 to the p-substrate 32, also may be removed, as is shown in FIG. 7. Alternatively, an n+ region may be used in place of the p+ region in FIG. 2. The p+ region or n+ region, as the case may be, does not need to be removed. If removed, the p-epitaxy layer 30 may be continued where the p+ region 31 or n+ region was located. With the removal of the body contact by the body contact removal routine 48 of FIG. 4, the body (p-substrate 32 and p-epitaxy layer 30) would be electrically floating. However, with the execution of the insertion routine 52 of the FIG. 4, a p-substrate tap 96 may be manually mounted to the backside of the p-substrate 32, such p-substrate tap 96 being used to apply body bias voltage, i.e., apply a "body bias" for testing purposes.

Figure 8:
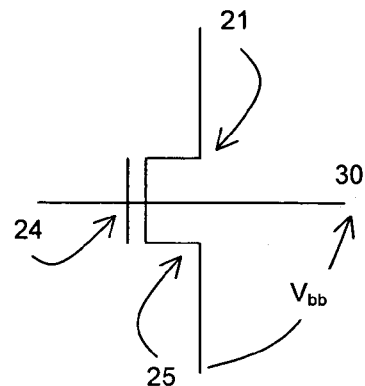
FIG. 8 is a schematic circuit diagram of the modified NMOS device of FIG. 7.

FIG. 8 shows the circuit diagram of the NMOS device 90 of FIG. 7. The source 25 and the body (p-epitaxy layer 30 and the p-substrate) are no longer shorted together. Instead, the p-substrate tap has been added to the substrate and a non-zero body bias voltage Vbb now is applied between the p-epitaxy layer 30 and the source 25. A bias circuit to provide the bias voltage Vbb for the fullchip verification 60 of FIG. 4 is described in FIG. 9.

Figure 9:
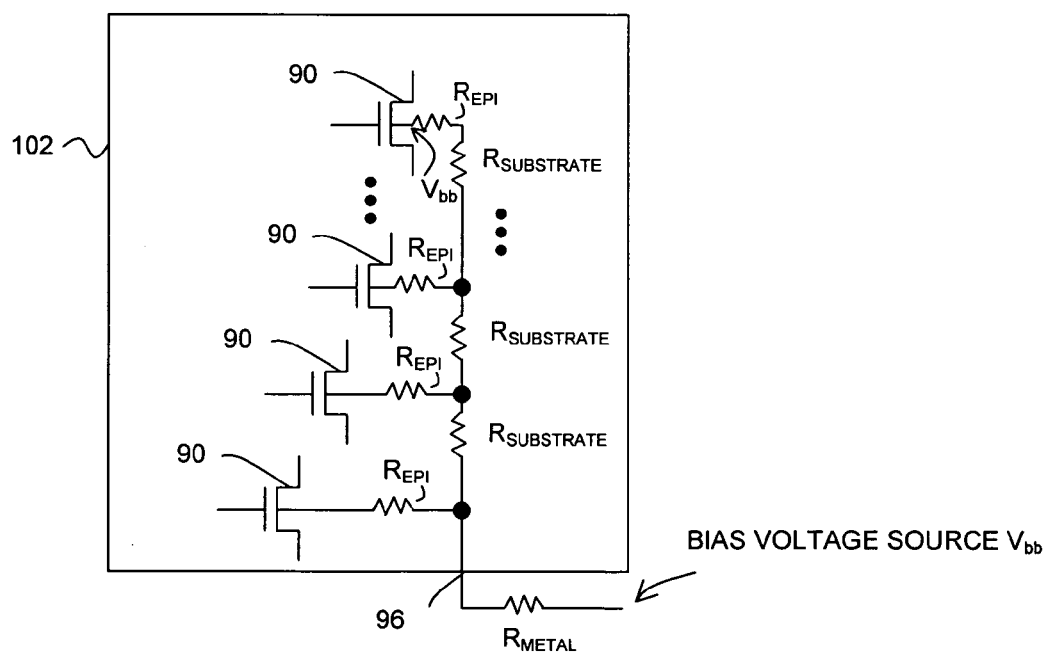
FIG. 9 is a schematic circuit diagram for applying a non-zero bias voltage to a substrate including the modified NMOS device of FIG. 7.

Referring to FIGS. 4, 7 and 9, a bias circuit 100 of FIG. 9 may be formed in part by the inclusion of a single p-substrate 96 (or more) in the manual insertion step 52 of FIG. 4. The bias circuit 100 is used to test the second modified IC design layout in the test database 54 by way of the fullchip verification 60 of FIG. 4 in a manner previously described to determine if any layers other than the desired body contacts have been removed. With the substrate tap 96 mounted to the backside of the p-substrate 32, the current conduction and distribution may be left to the p-epitaxy layer 30 and the p-substrate 32 of the IC. The bias circuit 100 biases a plurality of NMOS devices 90 via the single substrate tap 96. The bias circuit 100 includes a bias source voltage Vbs coupled to the plurality of NMOS devices 90 via a resistance $R_{METAL}$ and a plurality of resistances $R_{SUBSTRATE}$ and a plurality of resistances $R_{EPI}$. The resistance $R_{SUBSTRATE}$ is the resistance of the p-substrate 32 between successive NMOS devices and the resistance $R_{EPI}$ is the resistance of the p-epitaxy layer 30 between the p-substrate 32 and the NMOS device 90. The resistance $R_{METAL}$ is the resistance of the electrical conductor leading from a bias source voltage Vbs to the p-substrate tap 96. There is one resistance $R_{SUBSTRATE}$ and one resistance $R_{EPI}$ shown for each NMOS device 90. The resistance for current conduction in this case is dominated by the p-epitaxy layer 30 (lightly doped), since the resistance $R_{EPI}$ is typically in the range of approximately 2 orders of magnitude more resistive than the resistance $R_{SUBSTRATE}$ of the p-substrate 32 (heavily doped). Hence, the differing number of resistances $R_{SUBSTRATE}$ in the circuit to each of the NMOS devices 90 does not significantly vary the body bias voltages Vbb for each NMOS device 90.

After successful modification and testing of the removal of the body contacts by the body bias enabling process 40 of FIG. 4, in place of the single p-substrate tap, a plurality of substrate taps may be added to the IC design layout. An on-chip or off-chip bias circuit may be added, which may include an electrical grid which provides a p-substrate tap adjacent to each NMOS device. In this illustrative case, there may be one p-substrate added to the IC design layout for each NMOS device.

Figure 10:
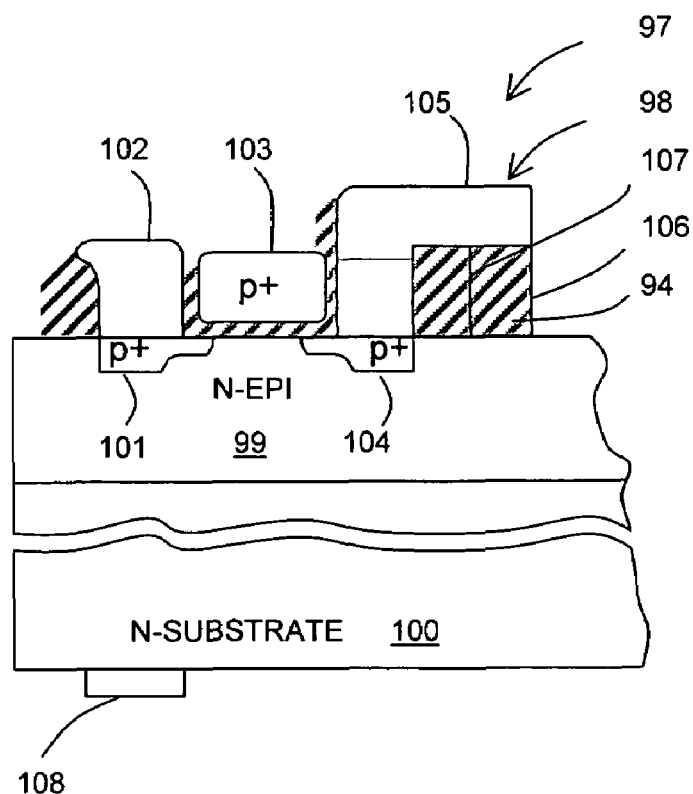
FIG. 10 is a cross-sectional view of a PMOS device in an integrated circuit chip using a P-well process after modification by the body contact removal process of FIG. 4.

FIG. 10 shows a cross-section of an IC 97 with a plurality of PMOS devices 98 (only one shown), which is modified by the process 40 of FIG. 4. In this case, the IC 97 uses a p-well process where the NMOS devices (not shown) are formed through diffusion in p-wells (not shown), while a plurality of the PMOS device 98 are form in an n-epitaxy layer 99 and the PMOS devices 98 have a common N-substrate 100. The PMOS device includes a p+ drain 101, drain contact 102, a p+ gate 103, a p+ source 104, and a truncated L-shaped source contact 105. Prior to application of the automatic removal routine 48 of FIG. 4, the L-shaped source contact 105 was a U-shaped contact (source and body contacts combined) of the same shape as shown in FIG. 2 for the NMOS device. The L-shaped source contact 105 results from the truncation of the original U-shaped contact. In FIG. 10, the body contact has been removed and an insulating material 106 has been put in its place. An n+ region (not shown), which previously connected the metal body contact to the n-substrate 100, also has been removed in FIG. 10, along with the body contact. Alternatively, this n+ region connected to the n-substrate may be left in the first and second modified IC design layouts. If removed, the n-epitaxy layer 99 may be continued where the n+ region was located. With the removal of the body contact by the body contact removal routine 48 of FIG. 4, the body (n-substrate 100 and n-epitaxy layer 99) would be electrically floating. However, with the execution of the insertion routine 52 of the FIG. 4, an n-substrate tap 108 may be manually mounted to the backside of the n-substrate 100, such n-substrate tap 100 being used to apply body bias voltage, i.e., apply a "body bias". Also, a p+ region may be used to connect between the body contact and the n-substrate 100. In this case, the removal routine 48 does not need to check and see if the p diffusion is located in a p-well.

Figure 11:
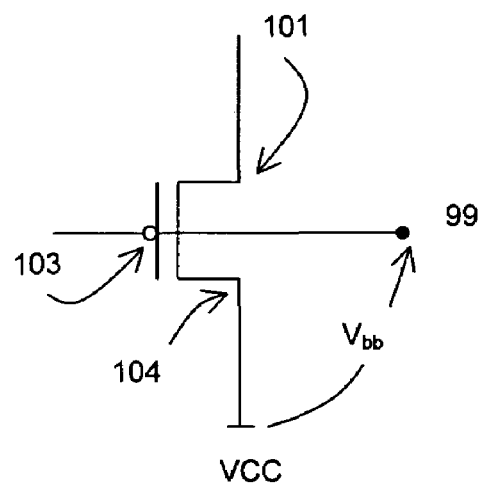
FIG. 11 is a schematic circuit diagram of the PMOS device of FIG. 10.

In FIG. 11 a circuit diagram of the PMOS device 98 of FIG. 10 is shown. Referring to FIGS. 4 and 11, the source 104 has a supply voltage Vcc and the body (n-epitaxy layer 99 and the n-substrate 100) are no longer shorted together as they were prior to the application of the body contact removal routine 48 (FIG. 4). More specifically, the initial IC design layout found in the existing database 46 (FIG. 4) for the PMOS device 98 is modified by the body contact removal routine 48 (FIG. 4) to obtain the first modified IC design layout contained in the modified database 50 (FIG. 4) for the PMOS device 98. Thereafter, the n-substrate tap has been added to the substrate 100 by the insertion routine of 52 (FIG. 4) and a body bias voltage Vbb now is applied between the n-epitaxy layer 99 and the source 25. In other respects, the process 40 may proceed in the same manner as undertaken for the NMOS devices.

Figure 12:
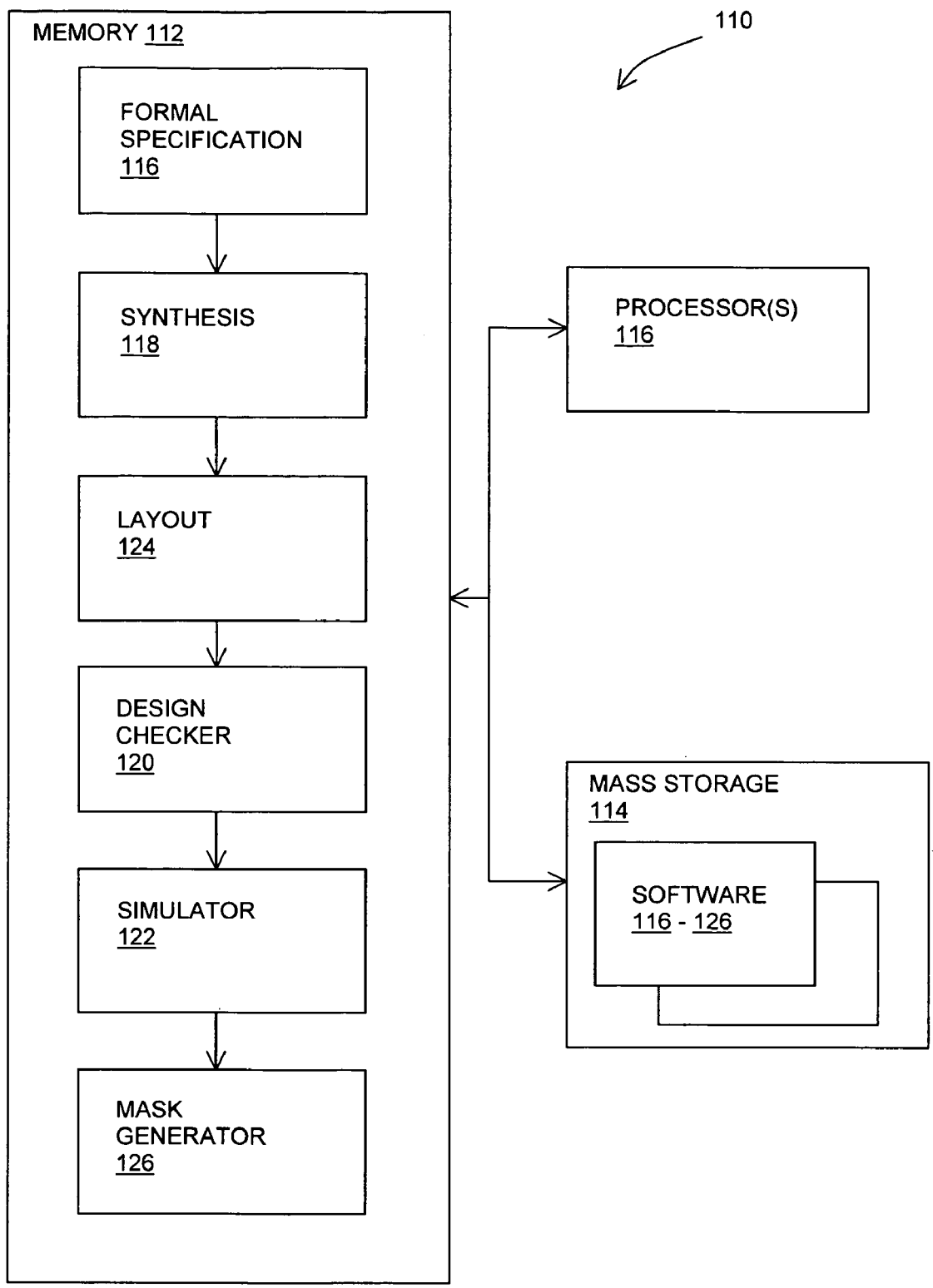
FIG. 12 is a block diagram of an EDA system incorporating one embodiment of the present invention.

FIG. 12 illustrates an EDA system 110 in which one embodiment according to the present invention is used. The EDA system 110 uses multiple pieces of software for the computer aided design for complex ICs. The EDA system 110 includes volatile and non-volatile storage 112 and 114 for storing temporal and persistent copies of the various pieces of software. The EDA system 110 further includes a number of processors 116 coupled to the storages 112–114 to execute the various software. The elements may be coupled to each other via local buses, system buses, peripheral buses, local area networks or wide area networks. In other words, EDA system 110 may be a standalone system, a cluster system, a local or remotely distributed system. The software includes a software suite of a formal specification compiler 116 and synthesis software 118 for use by a circuit designer to specify and generate an IC circuit design. The design may be stored in storage 112–114, and called up and displayed on a display device (not shown). The software also includes a design checker 120 and a circuit simulation program 122 to check and test the circuit operation. The software further includes a layout program 124 for use to generate component placement and layout of the integrated circuit, as discussed above with respect to FIG. 4. The layout program 124 may include the body bias enabling process 40 shown in FIG. 4. For the embodiment, the software also includes a mask generation program 126 for use to generate the specifications for the masks for manufacture of the integrated circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method, comprising:
  accessing an initial IC design layout in an electronic design automation (EDA) environment, the initial IC design layout including a plurality of MOSFET devices, with each of the MOSFET devices having a source and a body contact coupled to the source;
  programmatically examining the initial IC design layout to select from the body contacts a plurality of selected body contacts which are coupled to a common substrate, with the MOSFET devices having the selected body contacts being a selected one of a plurality of NMOS devices and a plurality of PMOS devices;
  programmatically removing the selected body contacts from the initial IC design layout to create a first modified IC design layout; and
  storing the first modified IC design layout.

2. The method according to claim 1, wherein the MOSFET devices having the selected body contacts comprise the plurality of NMOS devices; the common substrate is a common p-substrate; and a p-epitaxial layer is formed on the common p-substrate.

3. The method according to claim 2, wherein the programmatically examining of the initial IC design layout includes selecting as the selected body contacts each of the body contacts coupled to a p-diffusion located in the p-epitaxial layer and not in an n-well.

4. The method according to claim 1, wherein the MOSFET devices having the selected body contacts comprises the plurality of PMOS devices; the common substrate is a common n-substrate; and an n-epitaxial layer is formed on the common n-substrate.

5. The method according to claim 4, wherein the programmatically examining of the initial IC design layout includes selecting as the selected body contacts each of the body contacts coupled to an n-diffusion located in the n-epitaxial layer and not in a p-well.

6. The method according to claim 1, further comprising:
  accessing the first modified IC design layout in the EDA environment;
  interacting with the EDA environment to add a substrate tap to the substrate in the first modified IC design layout to create a second modified IC design layout; and
  storing the second modified IC design layout.

7. The method according to claim 6, wherein the initial IC design layout, the first modified IC design layout, and the second modified IC design layout are stored in an initial database, a first modified database, and a second modified database respectively.

8. The method according to claim 7, further comprising:
  verifying the initial IC design layout to generate at least one first log file;
  verifying the first modified IC design layout to generate at least one second log file;
  verifying the second modified IC design layout to generate at least one third log file;
  comparing the first and second log files to determine if the first and second log files are different or the same, and
  comparing the first and third log files to determine if the first and third log files are different or the same.

9. The method according to claim 8, wherein comparing the first and second log files further includes determining by the first and second log files being different that at least some of the body contacts have been removed from the first modified IC design layout; and wherein comparing the first and third log files further includes determining by the first and third log files being the same that in removing the body contacts no other layer has been removed from the first modified IC design layout.

10. The method according to claim 9, further comprising:
  after verifying, adding to the second modified IC design layout a plurality of substrate taps to the substrate and a bias circuit to deliver a biasing voltage to the substrate taps so as to provide a body bias voltage to the MOSFET devices.

11. The method according to claim 3, wherein each of the NMOS devices further includes the source being an n+ source, an n+ drain, and an n+ gate; a source contact coupled to the n+ source; and the body contact of each of the NMOS devices is coupled between the p-substrate and the source contact.

12. The method according to claim 5, wherein each of the PMOS devices further includes the source being a p+ source, a p+ drain, and a p+ gate; a source contact coupled to the p+ source; and the body contact of each of the PMOS device is coupled between the n-substrate and the source contact.

13. An article of manufacture, comprising:
  a computer usable medium having a computer readable code embedded therein to generate or read a preexisting design layout for an integrated circuit, the preexisting design layout having a plurality of MOSFET devices, with each of the MOSFET devices having a source and a body contact coupled to the source;
  the computer readable code including a body contact removal routine adapted to examine the preexisting design layout to select from the body contacts a plurality of selected body contacts which are coupled to a common substrate, with the MOSFET devices having the selected body contacts being a selected one of a plurality of NMOS devices and a plurality of PMOS devices; and the body contact removal routine being further adapted to remove the plurality of selected body contacts from the preexisting design layout to create a first modified layout.

14. The article of manufacture according to claim 13, wherein the MOSFET devices having the selected body contacts comprises the plurality of NMOS devices; the common substrate is a common p-substrate; and an epitaxial layer is formed on the common p-substrate.

15. The article of manufacture according to claim 14, wherein the body contact removal routine is operable to select and remove each of the body contacts which engages a p-diffusion located in the p-epitaxial layer.

16. The method according to claim 13, wherein the MOSFET devices having the selected body contacts comprises the plurality of PMOS devices and the common substrate is a common n-substrate.

17. The article of manufacture according to claim 16, wherein the body contact removal routine is operable to select and remove each of the body contacts which engages an n-diffusion located in the n-epitaxial layer.

18. The article of manufacture according to claim 13, wherein the computer readable code further includes an insertion routine to insert a substrate tap into the first modified layout to generate a second modified layout, the substrate tap being coupled to the substrate.

19. The article of manufacture according to claim 18, wherein the computer readable code further includes a first verification routine to verify the preexisting design layout and to generate at least one first log file and a second verification routine to verify the first modified layout and to generate at least one second log file and a third verification routine to verify the second modified layout and to generate at least one third log file.

20. The article of manufacture according to claim 15, wherein each of the plurality of NMOS devices has the source as an n+ source, a source contact coupled to the n+ source, and one of the body contacts, with the body contact being coupled between the source contact and the p-substrate.

21. The article of manufacture according to claim 17, wherein each of the plurality of PMOS devices has the source as a p+ source, a source contact couDled to the p+ source, and one of the body contacts, with the body contact being coupled between the source contact and the p-substrate.

22. A system, comprising:

a storage medium;

a layout program stored in the storage medium, the layout program including a body contact removal routine to examine a preexisting IC design layout having a plurality of MOSFET devices, with each of the MOSFET devices having a source and a body contact coupled to the source, so as to select from the body contacts a plurality of selected body contacts which are coupled to a common substrate, with the MOSFET devices having the plurality of selected body contacts being a selected one of a plurality of NMOS devices and a plurality of PMOS devices; and the body contact removal routine being further adapted to remove the selected body contacts from the preexisting IC design layout to create a first modified IC design layout; and at least one processor coupled to the storage medium to execute the layout program.

23. The system according to claim 22, wherein the MOSFET devices having the selected body contacts comprises a plurality of NMOS devices; the common substrate is a common p-substrate; and the body contact removal routine is operable to select and remove each of the contacts which is coupled to a p-diffusion not located in an n-well.

24. The system according to claim 22, wherein the MOSFET devices having the selected body contacts comprise a plurality of PMOS devices; the common substrate is a common n-substrate; and the body contact removal routine is operable to select and remove each of the body contacts which is coupled to an n-diffusion not located in a p-well.

25. The system according to claim 22, wherein the layout program further includes an insertion routine to facilitate a user to insert a substrate tap into the first modified IC design layout to generate a second modified IC design layout, the p-substrate tap being coupled to the common substrate.

26. The method according to claim 25, wherein the system further includes a first verification routine to verify the preexisting IC design layout and to generate a first log file; a second verification routine to verify the first modified IC design layout and to generate a second log file; and a third verification routine to verify the second modified IC design layout and to generate a third log file.

* * * * *

UNITED STATES PATENT AND TRADEMARK OFFICE
CERTIFICATE OF CORRECTION

PATENT NO. : 7,051,295 B2  
APPLICATION NO. : 10/746759  
DATED : May 23, 2006  
INVENTOR(S) : Narendra et al.

Page 1 of 1

It is certified that error appears in the above-identified patent and that said Letters Patent is hereby corrected as shown below:

Column 2  
Line 3, "...n-wells 12 and 14..." should read --...n-wells 14 and 16...--.  
Line 8, "...n-well 12 and n-well 14..." should read --...n-well 14 and n-well 16...--.  
Line 41, "...conditioning plate 21..." should read --...conditioning plate 32...--.

Column 4  
Line 59, "...p-epitaxial layer 30..." should read --...p-epitaxy layer 30...--.

Column 5  
Line 3, "...modified design database 50..." should read --...modified database 50...--.

Column 6  
Line 34, "...log files 62, 64, and 64..." should read --...log files 62, 64, and 66...--.

Column 8  
Lines 38-39, "...n-substrate tap 100..." should read --...n-substrate 100...--.  
Line 55, "...substrate 100..." should read --...n-substrate 100...--.

Column 11  
Line 43, "...couDled..." should read --...coupled...--.

Column 12  
Line 24, "...the contacts..." should read --...the body contacts...--.

Signed and Sealed this

Eighteenth Day of December, 2007

JON W. DUDAS  
*Director of the United States Patent and Trademark Office*